United States Patent
Okamura

(10) Patent No.: US 7,456,662 B2
(45) Date of Patent: Nov. 25, 2008

(54) DIFFERENTIAL CIRCUIT, OUTPUT BUFFER CIRCUIT AND SEMICONDUCTOR INTEGRATED CIRCUIT FOR A MULTI-POWER SYSTEM

(75) Inventor: Hitoshi Okamura, Gyeonggi-do (KR)

(73) Assignee: Samsung Electronics, Co., Ltd., Gyeonggi-do (KR)

( * ) Notice: Subject to any disclaimer, the term of this patent is extended or adjusted under 35 U.S.C. 154(b) by 117 days.

(21) Appl. No.: 11/485,339

(22) Filed: Jul. 13, 2006

(65) Prior Publication Data

US 2007/0018726 A1 Jan. 25, 2007

(30) Foreign Application Priority Data

Jul. 20, 2005 (KR) .................. 10-2005-0065557

(51) Int. Cl.
*H03F 3/45* (2006.01)
(52) U.S. Cl. ................. 327/52; 327/65; 327/563
(58) Field of Classification Search ............... 327/108, 327/52, 65, 89, 534, 563, 565, 566; 257/368
See application file for complete search history.

(56) References Cited

U.S. PATENT DOCUMENTS

| | | | | |
|---|---|---|---|---|
| 5,338,978 A | | 8/1994 | Larsen et al. ............... 326/21 |
| 5,966,041 A | | 10/1999 | Moane ....................... 327/417 |
| 5,973,558 A | * | 10/1999 | Date et al. .................. 330/51 |
| 6,211,725 B1 | * | 4/2001 | Kang ......................... 327/534 |
| 6,218,892 B1 | * | 4/2001 | Soumyanath et al. ....... 327/537 |
| 6,262,622 B1 | * | 7/2001 | Lee et al. .................... 327/543 |
| 6,384,664 B1 | | 5/2002 | Hellums et al. ............. 327/525 |
| 6,614,301 B2 | * | 9/2003 | Casper et al. ............... 330/253 |
| 6,621,327 B2 | * | 9/2003 | Kitamoto .................... 327/537 |
| 6,665,354 B1 | * | 12/2003 | Drapkin et al. ............. 375/316 |
| 7,030,699 B2 | * | 4/2006 | Richard et al. ............. 330/297 |
| 7,227,413 B1 | * | 6/2007 | Marty ......................... 330/261 |

\* cited by examiner

*Primary Examiner*—Lincoln Donovan
*Assistant Examiner*—Hai L. Nguyen
(74) *Attorney, Agent, or Firm*—Harness, Dickey & Pierce, P.L.C.

(57) ABSTRACT

An output buffer circuit includes: a differential circuit; and first and second load circuits coupled between the differential circuit and a high power supply voltage VDDH. Such a differential circuit includes first and second NMOS transistors having low-voltage gate dielectric layers susceptible to deterioration at operation above a maximum gate-body voltage VgbMAX (where VDDH>VgbMAX), respectively. Body electrodes & source electrodes are coupled to a common node. Gate electrodes are coupled to first and second differential input signals, respectively, such that voltages on drains of the first and second NMOS transistors represent results of a differential switching operation, respectively. More particularly, the drains of the first and second NMOS transistors are coupled to the first and second loads. The common node is coupled to a bias voltage such that Vgb of the first & second NMOS transistors is VgbMAX≧Vgb.

23 Claims, 8 Drawing Sheets

DIFFERENTIAL CIRCUIT, OUTPUT BUFFER CIRCUIT AND SEMICONDUCTOR INTEGRATED CIRCUIT FOR A MULTI-POWER SYSTEM

PRIORITY STATEMENT

This application claims priority to Korean Patent Application No. 2005-65557 filed on Jul. 20, 2005 in the Korean Intellectual Property Office (KIPO), the entire contents of which are herein incorporated by reference.

BACKGROUND

1. Field of the Invention

The present invention relates to a differential circuit, an output buffer and a semiconductor integrated circuit, and more particularly to a differential circuit, an output buffer and a semiconductor integrated circuit that can be used in a multi-power system.

2. Description of the Related Art

A power supply voltage used in a complementary metal-oxide semiconductor (CMOS) circuit has been decreasing according to the development of CMOS technology. Accordingly, it is becoming more difficult to provide a high output voltage at an output buffer using a conventional CMOS circuit.

FIG. 1 is a circuit diagram illustrating a conventional output buffer employing a transistor having a low-voltage gate oxide.

Referring to FIG. 1, the conventional output buffer circuit includes loads R11 and R12 coupled to a low power supply voltage VDDL, for example, about 1.2 volts, NMOS transistors NT11 and NT12 that function as a differential switching circuit, and an NMOS transistor NT13 that functions as a constant current source using a biasing control voltage Vc.

The output buffer circuit of FIG. 1 provides a low-voltage output signal using the low power supply voltage VDDL.

Particularly, the output buffer circuit of FIG. 1 receives two differential input voltages VI+ and VI− that swing between a first voltage level and a second voltage level, and provides differential output voltages VO+ and VO− that swing between a third voltage level and a fourth voltage level using the low power supply voltage VDDL.

The transistors NT11 and NT12 respectively are implemented with a low-voltage gate oxide transistor. The low-voltage gate oxide transistor includes a gate dielectric layer (for example, a gate oxide) having a thickness that can endure a voltage level of the low power supply voltage VDDL, for example, about 1.2 volts. That is, operation of the transistors NT11 and NT12 above a gate-body voltage VgbMAX significantly degrades the gate dielectric layer. A high-voltage gate oxide transistor includes a gate oxide having a thickness that can endure a voltage level of a high power supply voltage, for example, about 2.5 volts. The low-voltage gate oxide transistor may have a gate oxide that is relatively thin thickness compared with that of the high-voltage gate oxide transistor.

A body, i.e., a p-substrate, of the NMOS transistors NT11 and NT12 are coupled to a bias voltage of a ground level. Thus, a maximum voltage difference between a gate and a body of each of the transistors NT11 and NT12 is the low power voltage VDDL.

In the conventional output buffer circuit of FIG. 1, the NMOS transistors NT11 and NT12 are implemented with a low-voltage gate oxide NMOS transistor, of which a maximum allowable voltage is about 1.2 volts, and a high power supply voltage VDDH is coupled to the loads R11 and R12 so as to output a high-voltage output signal. Thus, a voltage difference Vgb between the gate and the body of each of the transistors NT11 and NT12 may be larger than the maximum allowable voltage of 1.2 volts of the low-voltage gate oxide NMOS transistor, and reliability of the thin gate oxide correspondingly is deteriorated.

Accordingly, since the reliability of the output buffer of FIG. 1 is deteriorated, the output buffer has to be implemented with a thick gate oxide transistor, i.e., a high-voltage transistor, as the differential switching transistor in order to operate at a high speed using a low-voltage NMOS transistor of a thin gate oxide, and simultaneously in order to obtain a high-voltage output signal by increasing a voltage level of the power supply voltage.

FIG. 2 is a circuit diagram illustrating a conventional output buffer circuit employing a transistor having a high-voltage gate oxide.

Referring to FIG. 2, the output buffer circuit includes loads R21 and R22 coupled to a high power supply voltage VDDH, for example, about 2.5 volts, NMOS transistors NT21 and NT22 that function as a differential switching circuit, and an NMOS transistor NT23 that functions as a constant current source.

The output buffer circuit of FIG. 2 provides a high-voltage output signal using the high power supply voltage VDDH.

Particularly, the output buffer circuit of FIG. 2 receives two differential input voltages VI+ and VI−, and provides differential output voltages VO+ and VO−, of which a maximum voltage level is substantially the same as a level of the high power supply voltage, using the high power supply voltage VDDH.

The transistors NT21 and NT22 respectively include a high-voltage gate oxide transistor that includes a gate oxide having a thickness that can endure a voltage level of the high power supply voltage VDDH, for example, about 2.5 volts. Bodies of the NMOS transistors NT21 and NT22 are coupled to a bias voltage of a ground level. Thus, a maximum voltage difference between a gate and a body of each of the transistors NT11 and NT12 is the high power supply voltage VDDH.

The thick gate oxide transistor cannot provide high operational speed due to relatively low driving capacity, compared with the thin gate oxide transistor.

When the NMOS transistors NT21 and NT22 employ a low-voltage gate oxide NMOS transistor in an output buffer circuit that operates at the high power supply voltage VDDH, the maximum voltage difference between the gate and the body of each of the transistors NT11 and NT12 may be the high power supply voltage VDDH.

However, the reliability of the low-voltage gate oxide transistor may be deteriorated due to a bias voltage higher than the maximum allowable voltage of the low-voltage gate oxide transistor. Thus, it is difficult to employ the low-voltage gate oxide transistor in an output buffer circuit that operates at a high power supply voltage.

That is, it is difficult to obtain high operational speed when the high-voltage gate oxide transistor is employed in the output buffer circuit that operates at the high power supply voltage, and operational reliability may be deteriorated when the low-voltage gate oxide transistor is employed in the output buffer circuit that operates at the high power supply voltage so as to obtain the high operational speed.

Therefore, the conventional output buffer circuit that operates at the high power supply voltage so as to obtain the high-voltage output signal cannot provide the high operational reliability and the high operational speed at the same time. That is, the conventional output buffer circuit that operates at the high power supply voltage cannot provide simultaneously both of the high operational speed and the high-voltage output signal.

SUMMARY

Accordingly, one or more embodiments of the present invention substantially obviate one or more problems due to limitations and disadvantages of the related art.

One or more embodiments of the present invention provide a differential circuit that may provide high operational speed, a high-voltage output signal and high operational reliability at the same time when the differential circuit is used in a multi-power system that operates at a high power supply voltage and a low power supply voltage.

One or more embodiments of the present invention also provide an output buffer circuit that may provide high operational speed, a high-voltage output signal and high operational reliability at the same time when the differential circuit is used in a multi-power system that operates at a high power supply voltage and a low power supply voltage.

One or more embodiments of the present invention also provide a semiconductor integrated circuit that may provide high operational speed, a high-voltage output signal and high operational reliability at the same time when the differential circuit is used in a multi-power system that operates at a high power supply voltage and a low power supply voltage.

One or more embodiments of the present invention provide an output buffer circuit comprising: a differential circuit; and first and second load circuits coupled between the differential circuit and a high power supply voltage VDDH. The differential circuit includes first and second NMOS transistors having low-voltage gate dielectric layers susceptible to deterioration at operation above maximum gate-body voltages VgbMAX1 (where VDDH>VgbMAX1) and VgbMAX2 (where VDDH>VgbMAX2), respectively. Body electrodes & source electrodes of the first and second NMOS transistors are coupled to a common node. Gate electrodes of the first and second NMOS transistors are coupled to first and second differential input signals, respectively, such that voltages on drains of the first and second NMOS transistors represent results of a differential switching operation upon the first and second differential input signals, respectively. The first load is coupled more particularly to a drain of the first NMOS transistor. The second load is coupled more particularly to a drain of the second NMOS transistor. The common node is coupled to a bias voltage such that Vgb1 & Vgb2 of the first & second NMOS transistors, respectively, are VgbMAX1≧Vgb1 and VgbMAX2≧Vgb2.

Additional features and advantages of the present invention will be more fully apparent from the following detailed description of example embodiments, the accompanying drawings and the associated claims.

BRIEF DESCRIPTION OF THE DRAWINGS

Example embodiments of the present invention will become more apparent by describing in detail example embodiments of the present invention with reference to the accompanying drawings, in which.

DETAILED DESCRIPTION OF EXAMPLE EMBODIMENTS

Figure 1:
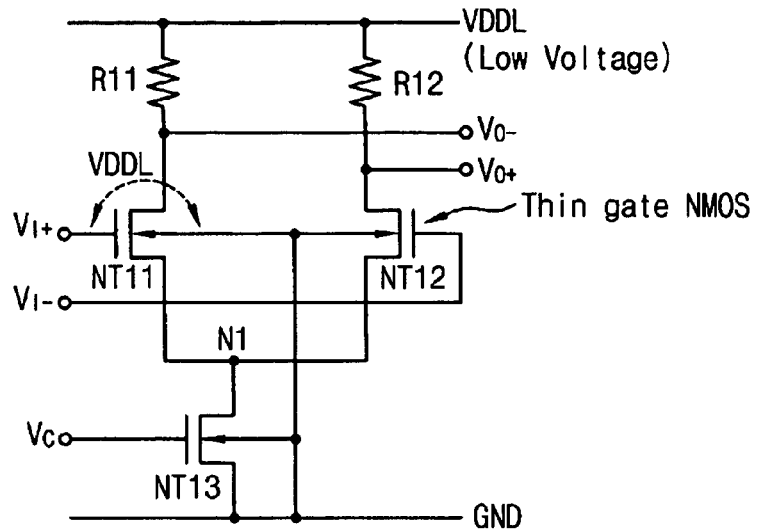
FIG. 1 is a circuit diagram illustrating a conventional output buffer circuit employing a transistor having a low-voltage gate oxide.
Figure 2:
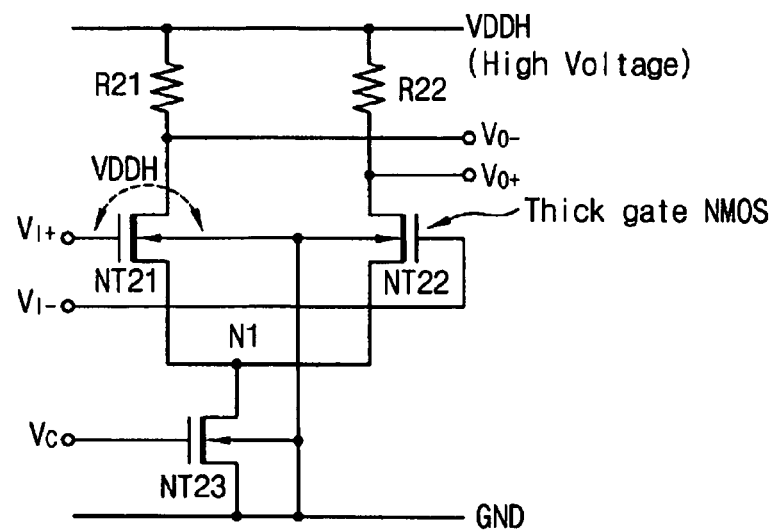
FIG. 2 is a circuit diagram illustrating a conventional output buffer circuit employing a transistor having a high-voltage gate oxide.

Example embodiments of the present invention are disclosed herein. However, specific structural and functional details disclosed herein are merely representative for purposes of describing example embodiments of the present invention. This invention may, however, be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In a multi-power system, a positive supply voltage VDD can take values in a range between a high power supply voltage VDDH and a low power supply voltage VDOL. The range of values may be continuous. Or it may have two discrete values, namely VDOH and VDDL.

Differential circuits according to example embodiments of the present invention may be applied to a multi-power system into which a high power supply voltage and a low power supply voltage are supplied. Hereinafter, it is assumed that the differential circuits according to example embodiments of the present invention are applied to a multi-power system into which two power supply voltages, such as a high power supply voltage VDDH and a low power supply voltage VDDL, are supplied.

Figure 3:
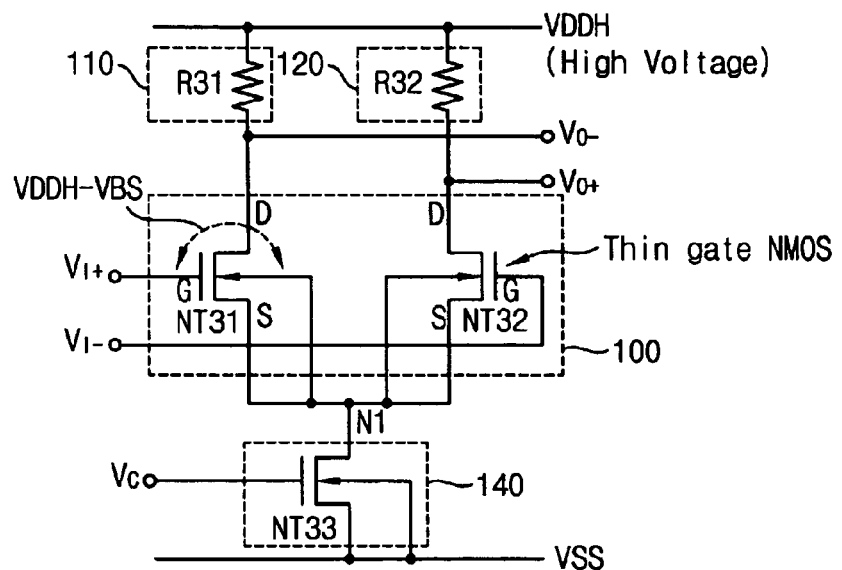
FIG. 3 is a circuit diagram illustrating an output buffer circuit a differential circuit employing a transistor having a low-voltage gate oxide, according to an example embodiment of the present invention.

FIG. 3 is a circuit diagram illustrating an output buffer circuit that includes a differential circuit employing a transistor having a low-voltage gate oxide according to an example embodiment of the present invention.

Referring to FIG. 3, the differential circuit includes a first load circuit 110 and a second load circuit 120 coupled to a high power supply voltage VDDH, a differential switching circuit 100, and a current source 140.

The first and second load circuits 110 and 120 may be implemented with a resistor. For example, the first load circuit 110 includes a resistor R31, and the second load circuit 120 includes a resistor R32. For example, the resistor R31 and the resistor R32 can have at least substantially the same resistance value. The first and second load circuits 110 and 120 may be implemented with other circuit elements, such as transistors, etc, that function as a resistor.

The differential switching circuit 100 may include N-type metal-oxide semiconductor (NMOS) transistors NT31 and NT32.

The transistor NT33 has a gate that is coupled to a bias voltage Vc, and operates at a saturation region. A magnitude of the constant current provided by the transistor NT33 may be determined by the control voltage Vc.

The NMOS transistors NT31 and Nt32 may both be a low-voltage gate oxide transistor that may endure a voltage level of a low power supply voltage, or the NMOS transistor NT32 may be a high-voltage gate oxide transistor that may endure a voltage level of the high power supply voltage VDDH. For example, when the low power supply voltage VDDL is about 1.2 volts, a maximum allowable voltage of the low-voltage gate oxide transistor is about 1.2 volts, and, when the high power supply voltage VDDH is about 2.5 volts, a maximum allowable voltage of the high-voltage gate oxide transistor is about 2.5 volts.

The current source 140 may include an NMOS transistor NT33. The current source 140 may be implemented with any other circuit element that functions as a current source. For example, the current source 140 may be replaced by a load circuit including a resistor.

The high power supply voltage VDDH (shown in FIG. 3) may have a high voltage, for example, higher than 2.5 volts, and the low power supply voltage VDDL may have a low voltage, for example, lower than 1.2 volts. Hereinafter, it is assumed that the high power supply voltage VDDH has a voltage level of 2.5 volts and the low power supply voltage VDDL has a voltage level of 1.2 volts.

A power supply voltage VSS may be a ground voltage, or alternatively may be a negative voltage while a voltage difference between the high power supply voltage VDDH and the power supply voltage VSS is maintained to be about 2.5 volts.

The transistors NT31 and NT32 respectively include a thin gate oxide layer that may endure the low power supply voltage VDDL. That is, operation of the transistors NT31 and NT32 at a gate-body voltage Vgb above a gate-body maximum voltage VgbMAX=VDDL is likely to significantly deteriorate the gate oxide layer. Typically, VgbMAX≧VDDL. Here, it is assumed that VgbMAX for each of the transistors NT31 is the same; alternatively, they can be different. Bodies (B) of the transistors NT31 and NT32 are connected to a node N1.

Operation of the differential circuit 100 of FIG. 3 includes doing the following: receiving two differential input voltages VI+ and VI− that swing between a first voltage level and a second voltage level via gates of the transistors NT31 and NT32; performing a differential switching on the two differential input voltages VI+ and VI−; and providing two differential output voltages VO+ and VO− that swing between a third voltage level and a fourth voltage level to drains of the transistors NT31 and NT32. Namely, the differential circuit of FIG. 3 operates at the high power supply voltage VDDH as a power supply voltage to provide a high-voltage output signal.

The first load circuit 110 and the differential switching circuit 100 together can be described as representing a first voltage divider network connected between the high power supply voltage VDDH and the node N1. Similarly, the second load circuit 120 and the differential switching circuit 100 together can be described as representing a second voltage divider network connected between the high power supply voltage VDDH and the node N1.

Figure 4:
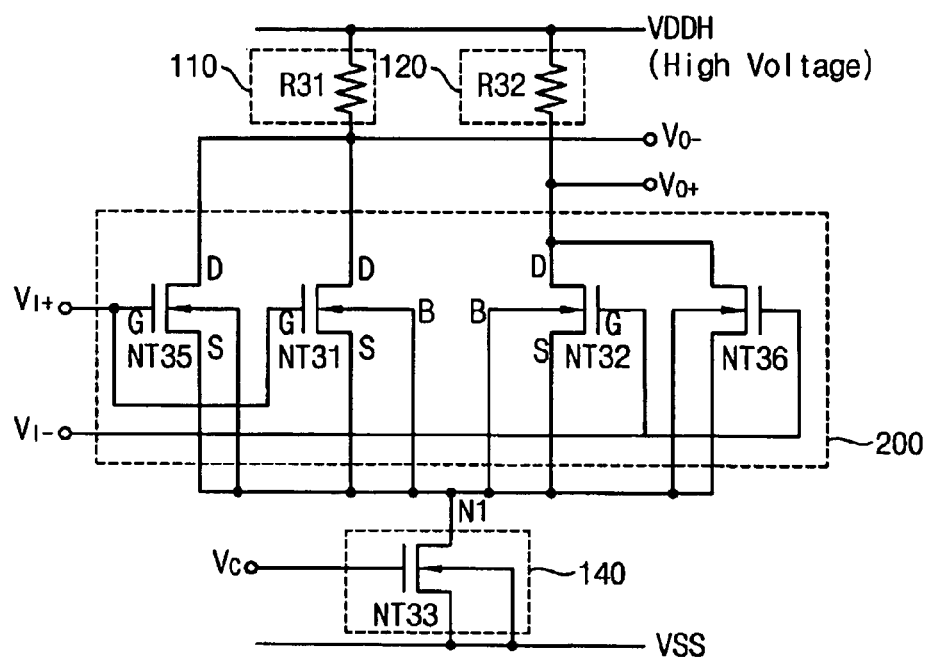
FIG. 4 is a circuit diagram illustrating an output buffer circuit a differential circuit employing a transistor having a low-voltage gate oxide, according to another example embodiment of the present invention.

FIG. 4 is a circuit diagram illustrating an output buffer circuit including a differential circuit 200 employing a transistor having a low-voltage gate oxide according to another example embodiment of the present invention.

Referring to FIG. 4, the differential circuit 200 includes a first load circuit 110 and a second load circuit 120 coupled to a high power supply voltage VDDH, a differential switching circuit 200, and a current source 140.

The configurations of the first load circuit 110 and the second load circuit 120 of FIG. 4 are the same as those of the first load circuit 110 and the second load circuit 120 of FIG. 3.

The differential switching circuit 200 may include two NMOS transistors NT31 and NT35 that receive a differential input voltage VI+, and two NMOS transistors NT32 and NT36 that receive a differential input voltage VI−. Alternatively, the differential switching circuit 200 may be implemented with K1 number of NMOS transistors that receive the differential input voltage VI+ and K1 number of NMOS transistors that receive the differential input voltage VI−, in which K1 is greater than or equal to three.

The transistors NT31, NT35, NT32 and NT36 respectively include the thin gate oxide that may endure the low power supply voltage VDDL, i.e., operation at Vgb>VgbMAX (where VgbMAX=VDDL) is likely to deteriorate the gate oxide. Bodies (B) of the transistors NT31, NT35, NT32 and NT36 are connected to the common node N1.

The differential circuit 200 receives the two differential input voltages VI+ and VI− that swing between a first voltage level and a second voltage level via gates of the transistors NT31, NT35, NT32 and NT36, performs a differential switching on the two differential input voltages VI+ and VI−, and provides two differential output voltages VO+ and VO− that swing between a third voltage level and a fourth voltage level to drains of the transistors NT31, NT35, NT32 and NT36.

The current source 140 may be implemented with any circuit element, which functions as a current source, other than the NMOS transistor. For example, the current source 140 may be replaced by a load circuit such as a resistor.

Figure 5:
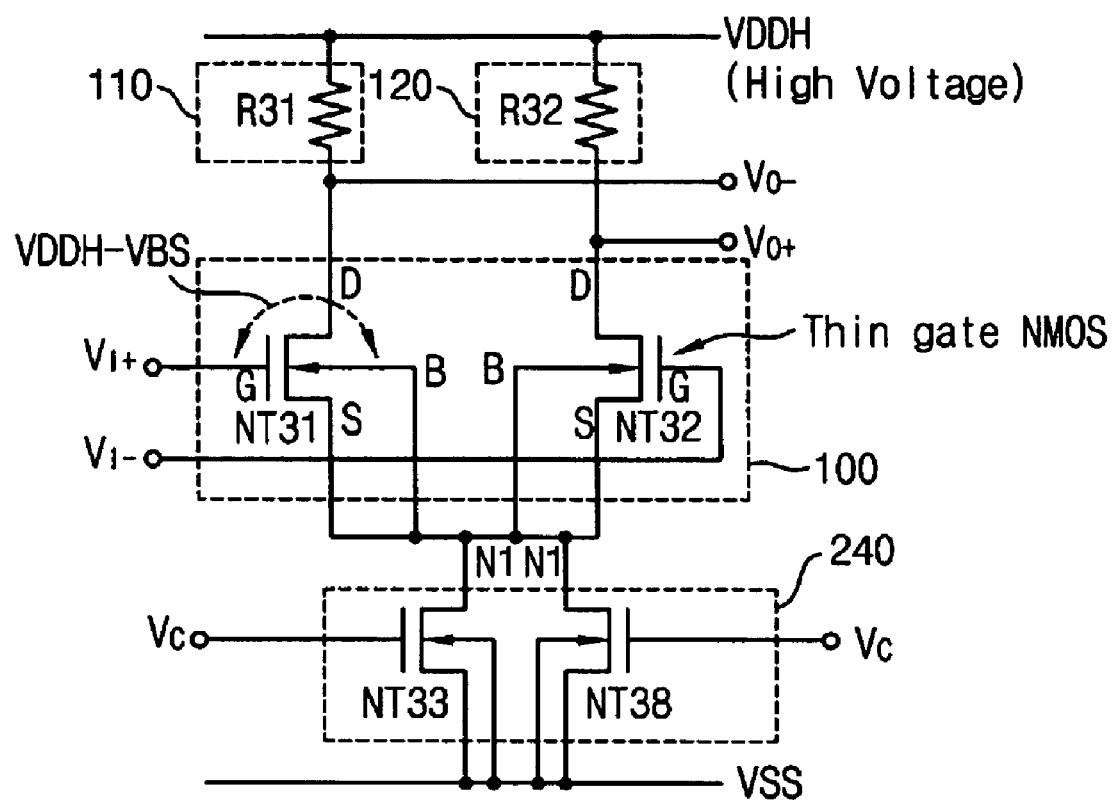
FIG. 5 is a circuit diagram illustrating an output buffer circuit a differential circuit employing a transistor having a low-voltage gate oxide according to still another example embodiment of the present invention.

FIG. 5 is a circuit diagram illustrating an output buffer that includes a differential circuit employing a transistor having a low-voltage gate oxide, according to still another example embodiment of the present invention.

Referring to FIG. 5, the differential circuit includes a first load circuit 110 and a second load circuit 120 coupled to a high power supply voltage VDDH, a differential switching circuit 100, and a current source 240.

The configurations of the first load circuit 110 and the second load circuit 120 of FIG. 5 are the same as those of the first load circuit 110 and the second load circuit 120 of FIG. 3.

The current source 240 may be implemented with two NMOS transistors NT33 and NT38 coupled in parallel to each other. Alternatively, the current source 240 may be implemented with K2 number of NMOS transistors coupled in parallel to one another. K2 may be more than or equal to three. The current source 240 may be implemented with any circuit element, which functions as a current source, other than the NMOS transistors. The current source 240 may be replaced by a load circuit such as a resistor.

Figure 6:
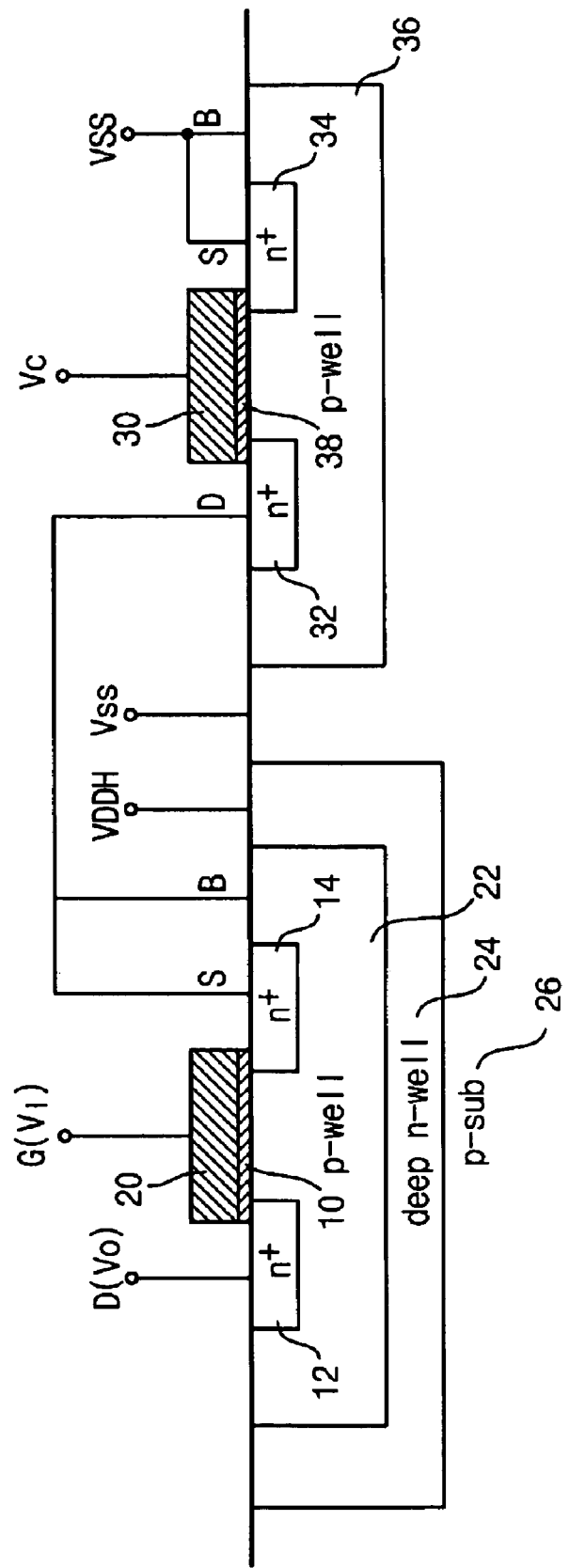
FIG. 6 is a cross-sectional view illustrating in more detail (according to an example embodiment of the present invention) a differential switching N-type metal-oxide semiconductor (NMOS) transistor NT31 (or NT32) and a current source NMOS transistor NT33, which is manufactured by a complementary metal-oxide semiconductor (CMOS) manufacturing process, in the differential circuit of FIG. 3.

FIG. 6 is a cross-sectional view illustrating in more detail (according to an example embodiment of the present invention) a differential switching NMOS transistor NT31 (or NT32) and a current source NMOS transistor NT33, which is manufactured by a complementary metal-oxide semiconductor (CMOS) manufacturing process, in the differential circuit of FIG. 3.

Referring to FIG. 6, the NMOS transistor NT31 (or NT32) includes a P-type substrate (p-substrate) 26, a P-well 22, a deep N-well 24, a source electrode 12, a drain electrode 14, a gate oxide 10 and a gate electrode 20. In addition, the NMOS transistor NT33 includes a P-well 36, a source electrode 34, a drain electrode 32, a gate oxide 38 and a gate electrode 30.

The NMOS transistor NT31 (or NT32) and NT33 may be manufactured by a well-known CMOS processing technology, and thus a detailed description of the manufacturing process will be omitted.

The deep N-well 24 may be formed by lightly diffusing an n-type impurity such as phosphorous into the p-type substrate 26. The P-wells 22 and 36 may be formed by implanting a p-type impurity. The source electrodes 12 and 34 and the drain electrodes 14 and 32 may be formed by heavily diffusing an n-type impurity.

The deep N-well 24 separates the P-well 22 from the P-type substrate 26, and separates the P-well 22 from the P-well 36.

The deep N-well 24 is coupled to a reversely biasing voltage so as to prevent a latch-up due to a pnp junction between the P-well 22, the deep N-well 24 and the P-type substrate 26. For example, the deep N-well 24 is coupled to a reversely biasing voltage such as the high power supply voltage VDDH.

The P-type substrate 26 is coupled to a bias voltage such as VSS so as to reduce a body effect.

The transistor NT31 (or NT32) includes a thin gate oxide 10 that may endure the low power supply voltage VDDL.

In the buffer circuit according to an example embodiment of the present invention, the low-voltage gate oxide transistors NT31 and NT32 include a thin gate oxide, e.g., 10, having a thickness that can endure a voltage level of the low power supply voltage VDDL, i.e., operation at Vgb>VgbMAX, where VgbMAX=VDDL is likely to significantly deteriorate the gate oxide.

In addition, the buffer circuit according to an example embodiment of the present invention, the bodies 22 (i.e., P-wells) of the low-voltage gate oxide transistor NT31 and NT32 are not connected to ground, but is connected to a common node N1. The buffer circuit according to an example embodiment of the present invention differs from the conventional buffer circuit in that, e.g., the bodies 22 of the low-voltage gate oxide transistor NT31 and NT32 are not connected to ground, but are connected to a bias voltage having a voltage level VBS, e.g., VBS=VN1 where VN1 is the voltage on node N1, higher than the ground voltage, e.g., by a threshold voltage level.

Thus, a maximum voltage difference between the gate and the body of the transistor NT31 (or NT32) is VDDH−VBS.

When the high power supply voltage VDDH is about 2.5 volts, the low power supply voltage VDDL is about 1.2 volts, and VBS is about 1.3 volts in the multi-power system, the maximum voltage difference Vgb between the gate and the body of the transistor NT31 (or NT32) is 1.2 volts, and thus is less than the low power supply voltage VDDL. In addition, a maximum voltage difference Vgd between the gate and the drain of the transistor NT31 (or NT32), a maximum voltage difference Vds between the drain and the source of the transistor NT31 (or NT32), and a maximum voltage difference Vgs between the gate and the source of the transistor NT31 (or NT32) are less than the low power supply voltage VDDL.

The low-voltage gate oxide transistor instead of the high-voltage gate oxide transistor may be used in the differential circuit that operates at the high power supply voltage, and thus high operational speed and high operational reliability may be obtained at the same time.

Figure 7:
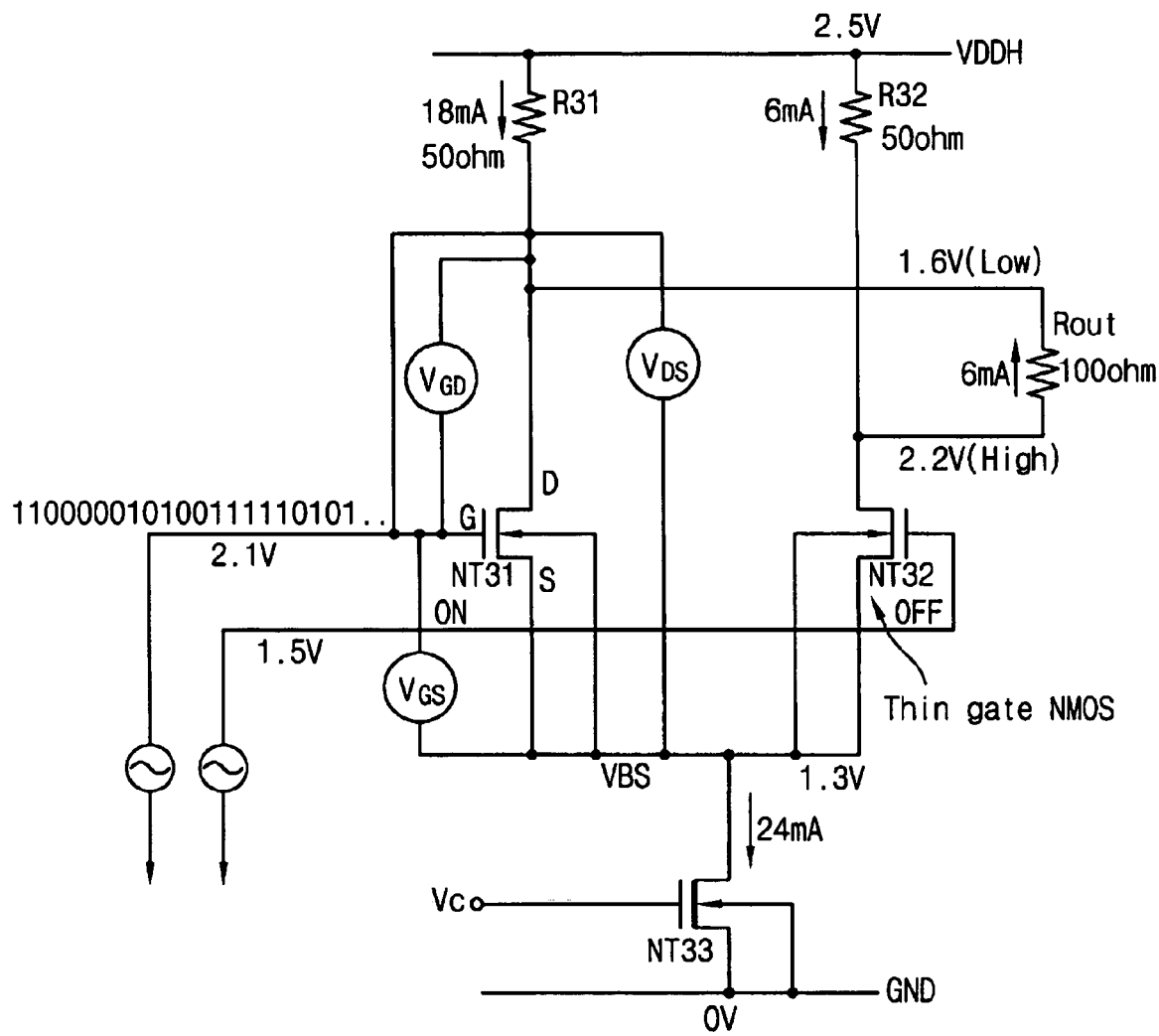
FIG. 7 is a circuit diagram illustrating a simulation benchmark of each of the nodes in a particular example implementation of the differential circuit of FIG. 3 when the differential circuit is used as an output buffer.

FIG. 7 is a circuit diagram illustrating a simulation benchmark of each of the nodes in a particular example implementation of the differential circuit of FIG. 3 when the differential circuit is used as an output buffer.

Referring to FIG. 7, serialized input data '1100000101001111110101' are inputted to the gate electrodes of the transistor NT31 and NT32. A logic level '1' represents a voltage level of about 2.1 volts, and a logic level '0' represents a voltage level of about 1.5 volts. When a differential input voltage VI+ has the logic level '1', an inverted differential input voltage VI− has the logic level '0'.

A set of simulation conditions is described below. The high power supply voltage VDDH is 2.5 volts, VSS is the ground, voltage having 2.1 volts corresponding to the logic level '1' is applied to the gate electrode of the NMOS transistor NT31, and voltage having 1.5 volts corresponding to the logic level '0' is applied to the gate electrode of the NMOS transistor NT32. In addition, the load resistors R31 and R32 respectively have 50ohms, the current source NT33 provides a current of 24 mA, the common node voltage VBS is 1.3 volts. A voltage of the differential output nodes is measured by connecting an output resistor Rout having 100 ohms between the drain electrode of the NMOS transistor NT31 and the drain electrode of the NMOS transistor NT32. A voltage of a first differential output node, i.e., the drain electrode of the NMOS transistor NT31, is 1.6 volts, and a voltage of a second differential output node, i.e., the drain electrode of the NMOS transistor NT32, is 2.2volts.

Since the common node voltage VBS is 1.3 volts and Vgs of the NMOS transistor NT31 is 0.8 volts (2.1 volts−1.3 volts) higher than a threshold voltage of the NMOS transistor NT31, the NMOS transistor NT31 is turned on. Since Vgs of the NMOS transistor NT32 is 0.2 volts (1.5 volts−1.3 volts) lower than a threshold voltage of the NMOS transistor NT32, the NMOS transistor NT32 is turned off.

Thus, since the body nodes of the NMOS transistors NT31 and NT32 have the same voltage level of 1.3 volts of the common node voltage VBS, Vgb of the NMOS transistor NT31 is 0.8 volts and the Vgb of the NMOS transistor NT32 is 0.2 volts. Namely, the maximum voltage difference between the gate and the body Vgb of the differential switching NMOS transistor NT31 (or NT32) is 0.8 volts, and thus is maintained to be lower than the maximum allowable voltage of 1.2 volts of the low-voltage gate oxide NMOS transistor.

In a condition in which the high power supply voltage VDDH is applied to the conventional output buffer of FIG. 1 that operates at a low-voltage gate oxide NMOS transistor, of which a maximum allowable voltage is 1.2 volts, Vgb is 2.1 volts when 2.1 volts of differential input voltage is applied to the gate of the NMOS transistor NT31. Thus, Vgb is higher than the maximum allowable voltage of 1.2 volts. Accordingly, when the low-voltage gate oxide NMOS transistor is used in the conventional output buffer, the reliability of the thin gate oxide of the low-voltage gate oxide NMOS transistor is deteriorated due to the gate bias voltage that is higher than the maximum allowable voltage of the low-voltage gate oxide NMOS transistor.

However, in the differential circuit according to one or more example embodiments of the present invention, even when the low-voltage gate oxide NMOS transistor of which a maximum allowable voltage is 1.2 volts is used as the differential switching NMOS transistor, Vgs is 0.8 volts at maximum, Vgd is 0.8 volts at maximum, and the gate bias voltage does not exceed the maximum allowable voltage of 1.2 volts of the low-voltage gate oxide NMOS transistor. Accordingly, high operational speed due to the low-voltage gate oxide NMOS transistor may be obtained and the problem in which the operational reliability is deteriorated may be overcome at the same time.

Figure 8:
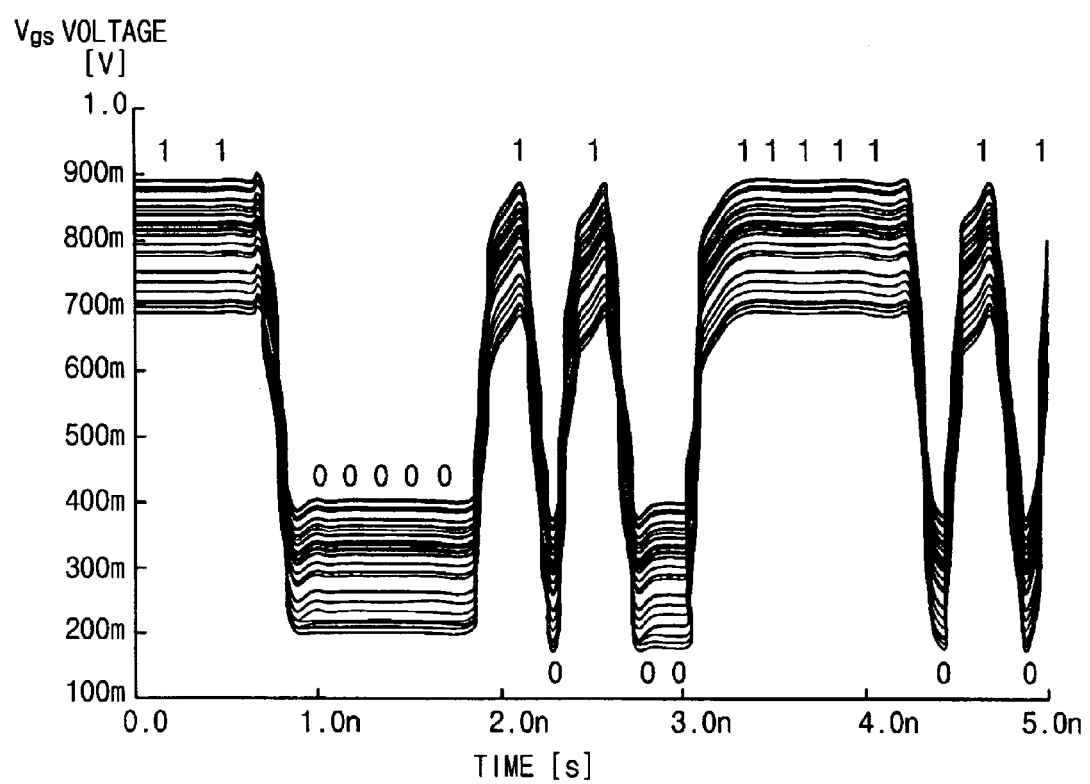
FIG. 8 is a graph illustrating a gate-source voltage Vgs of a differential switching NMOS transistor of FIG. 7.
Figure 9:
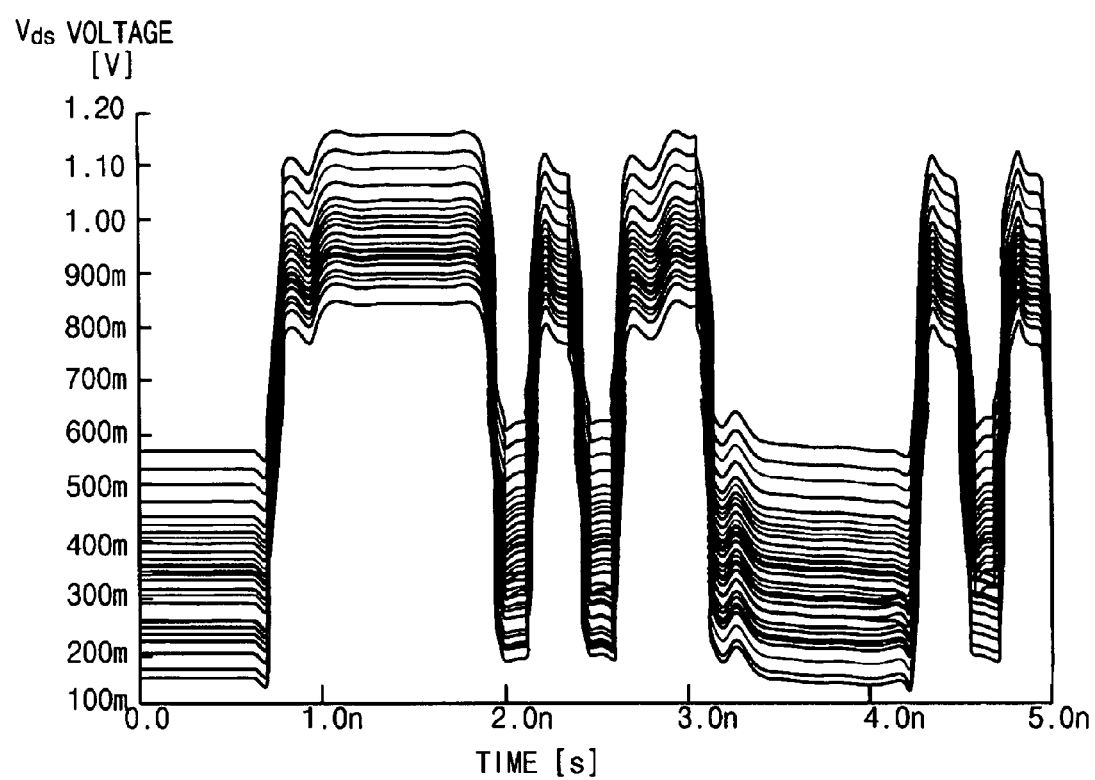
FIG. 9 is a graph illustrating a drain-source voltage Vds of the differential switching NMOS transistor of FIG. 7.
Figure 10:
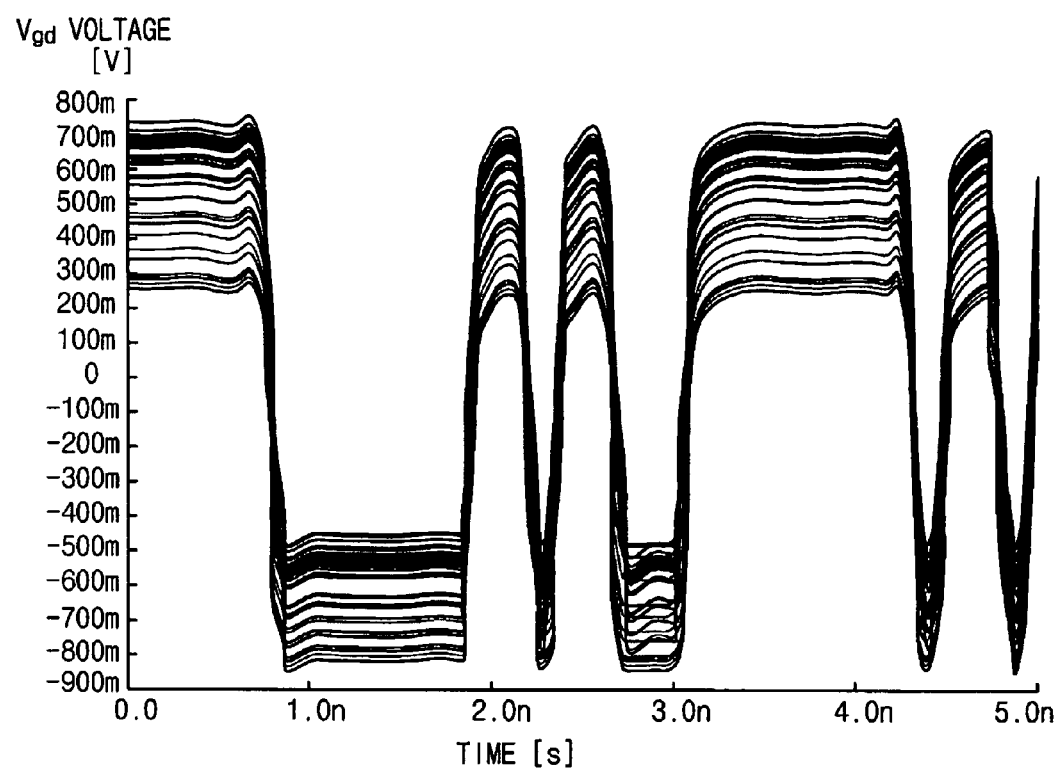
FIG. 10 is a graph illustrating a gate-drain voltage Vgd of the differential switching NMOS transistor of FIG. 7.

FIGS. 8, 9 and 10 are graphs respectively illustrating a gate-source voltage Vgs, a drain-source voltage Vds, and a gate-drain voltage Vgd of the differential switching NMOS transistor of FIG. 7. FIGS. 8, 9 and 10 show simulation results of all available values of Vgs, Vds and Vgd at a worst condition when example serialized input data '110000010100111110101' are inputted to the gate electrode of the transistor NT31 or NT32.

Referring to FIGS. 8, 9 and 10, Vgs, Vds and Vgd of the differential switching NMOS transistor NT31 (or NT32) are lower than 1.2 volts of the low power supply voltage VDDL.

The differential circuit or the output buffer circuit according to one or more example embodiments of the present invention may be applied to a multi-power system into which a high power supply voltage VDDH and a low power supply voltage VDDL are supplied. The low-voltage gate oxide transistor instead of the high-voltage gate oxide transistor is used in the differential switching NMOS transistor that operates at the high power supply voltage, and the body of the differential switching NMOS transistor is not connected to the ground but is connected to the source node (or a common node).

Accordingly, high operational speed may be obtained since the low-voltage gate oxide NMOS transistor is used in the differential switching transistor of the differential circuit or the output buffer circuit, and, at the same time, the problem in which the operational reliability is deteriorated may be overcome since the voltage difference between the gate and the body of the differential switching NMOS transistor is maintained to be lower than the maximum allowable voltage of the low-voltage gate oxide transistor.

While the example embodiments of the present invention and their advantages have been described in detail, it should be understood that various changes, substitutions and alterations may be made herein without departing from the scope of the invention.

What is claimed is:

1. A differential circuit operating at a high supply voltage, the circuit comprising:
   first and second NMOS transistors having low-voltage gate dielectric layers susceptible to deterioration at operation above first and second maximum gate-body voltages, respectively, each of the maximum gate-body voltage being a voltage at which the low-voltage gate dielectric layers is susceptible to deterioration,
   source electrodes of the first and second NMOS transistors being coupled to a common node,
   gate electrodes of the first and second NMOS transistors being coupled to first and second differential input signals, respectively,
   drain electrodes on the first and second NMOS transistors being coupled at least indirectly to a high power supply voltage, wherein the high power supply voltage is a voltage higher than the first and second maximum gate-body voltages of the first and second NMOS transistors, respectively,
   voltages on the drain electrodes representing results of a differential switching operation upon the first and second differential input signals, respectively, and
   bodies of the first and second NMOS transistors are coupled to a bias voltage such that first and second gate-body voltages of the first and second NMOS transistors are less than or equal to the first and second maximum gate-body voltages of the first and second NMOS transistors, respectively.

2. The differential circuit of claim 1, wherein the differential circuit is used in a multi-power system for which a power supply voltage varies in a range from the high power supply voltage to a low power supply voltage, wherein the low power supply voltage is a voltage lower than the first and second maximum gate-body voltages of the first and second NMOS transistors.

3. The differential circuit of claim 2, wherein the first and second NMOS transistors are a low-voltage NMOS transistor, respectively, wherein the low-voltage NMOS transistor is only able to endure the low power supply voltage.

4. The differential circuit of claim 3, wherein each of the bodies of the first and second NMOS transistors is coupled to the common node.

5. The differential circuit of claim 4, further comprising:
   a current source circuit coupled between the common node and a node having a system ground voltage.

6. The differential circuit of claim 4, wherein each of the first transistor and second NMOS transistors includes:

a P-type substrate coupled to the system ground voltage;
a P-well that functions as the body;
a deep N-well formed between the P-well and the P-type substrate, and coupled to a reversely biasing voltage;
a first n-type impurity doped surface portion of the P-well that functions as the drain electrode;
the gate electrode; and
a low-voltage gate dielectric layer formed on a surface of the P-well between the source electrode and the drain electrode, wherein the low-voltage gate dielectric layer is only able to endure the low power supply voltage.

7. The differential circuit of claim 4, further comprising:
a load circuit coupled between the high power supply voltage and a differential switching circuit.

8. The differential circuit of claim 6, wherein the load circuit comprises:
a first load circuit coupled between the high power supply voltage and the first NMOS transistor; and
a second load circuit coupled between the high power supply voltage and the second NMOS transistor.

9. The differential circuit of claim 4, wherein the current source circuit includes one of a transistor having a the low-voltage gate dielectric layer and a transistor having a high-voltage gate dielectric layer, wherein the high-voltage gate dielectric layer is able to endure the high power supply voltage.

10. An output buffer circuit comprising:
a differential circuit including first and second NMOS transistors having low-voltage gate dielectric layers susceptible to deterioration at operation above first and second maximum gate-body voltages, respectively, each of the maximum gate-body voltage being a voltage at which the low-voltage gate dielectric layers is susceptible to deterioration,
body electrodes & source electrodes of the first and second NMOS transistors being coupled to a common node,
the first and second NMOS transistors having gate electrodes coupled to first and second differential input signals, respectively, and
voltages on drains of the first and second NMOS transistors representing results of a differential switching operation upon the first and second differential input signals, respectively;
a first load coupled between a high power supply voltage, wherein the high power supply voltage is a voltage higher than the first and second maximum gate-body voltages of the first and second NMOS transistors and a drain of the first NMOS transistor;
a second load coupled between the high power supply voltage, and a drain of the second NMOS transistor; and
wherein the common node is coupled to a bias voltage such that first and second gate-body voltages of the first and second NMOS transistors are less than or equal to the first and second maximum gate-body voltages of the first and second MNOS transistors, respectively.

11. The differential circuit of claim 10, further comprising:
a current source circuit coupled between the common node and a node having a system ground voltage.

12. The differential circuit of claim 11, wherein the differential circuit is used in a multi-power system for which a power supply voltage varies in a range from the high power supply voltage to a low power supply voltage, wherein the low power supply voltage is a voltage lower than the first and second maximum gate-body voltages of the first and second NMOS transistors.

13. The differential circuit of claim 12, wherein each of the first transistor and second NMOS transistors includes:

a P-type substrate coupled to the system ground voltage;
a P-well that functions as the body;
a deep N-well formed between the P-well and the P-type substrate, and coupled to a reversely biasing voltage;
a first n-type impurity doped surface portion of the P-well that functions as the drain electrode;
the gate electrode; and
a low-voltage gate dielectric layer formed on a surface of the P-well between the source electrode and the drain electrode, wherein the low-voltage gate dielectric layer is only able to endure the low power supply voltage.

14. An output buffer circuit used in a multi-power system operating at a high power supply voltage and a low power supply voltage, wherein the high power supply voltage is higher than then the low power supply voltage, the high power supply voltage being supplied to the output buffer, the output buffer comprising:
a differential circuit including first and second NMOS transistors having low-voltage-gate dielectric layers susceptible to deterioration at operation above first and second maximum gate-body voltages, respectively, each of the maximum gate-body voltage being a voltage at which the low-voltage gate dielectric layers is susceptible to deterioration,
body electrodes & source electrodes of the first and second NMOS transistors being coupled to a common node,
the first and second NMOS transistors having gate electrodes coupled to first and second differential input signals, respectively, and
voltages on drains of the first and second NMOS transistors representing results of a differential switching operation upon the first and second differential input signals, respectively; and
a load coupled between a high power supply voltage and drain electrodes of the first and second NMOS transistors, wherein the high power supply voltage is greater than the first and second maximum gate-body voltages of the first and second NMOS transistors;
wherein the common node is coupled to a bias voltage such that a second gate-body voltage of the second NMOS transistor is less than or equal to the second maximum gate-body voltage of the second NMOS transistor.

15. The output buffer circuit of claim 14, further comprising:
a current source circuit coupled between the common node and a node having a system ground voltage.

16. The output buffer circuit of claim 14, wherein each of the first and second NMOS transistors includes:
a P-type substrate coupled to the system ground voltage;
a P-well that functions as the body;
a deep N-well formed between the P-well and the P-type substrate, and coupled to a reversely biasing voltage;
a first n-type impurity doped surface portion of the P-well that functions as the drain electrode;
the gate electrode; and
a low-voltage gate dielectric layer formed on a surface of the P-well between the source electrode and the drain electrode, wherein the low-voltage gate dielectric layer is only able to endure the low power supply voltage.

17. A semiconductor integrated circuit used in a multi-power system, the semiconductor integrated circuit comprising:
a differential switching circuit, including first and second NMOS transistors that switch first and second input signals to produce first and second output signals, respectively, and arranged as follows,
a P-type substrate, first and second P-wells corresponding to bodies of the first and second NMOS transistors, respectively, a deep N-well separating the first P-well from the P-type substrate, source and drain regions in the each of the first and second P-wells, low-voltage gate dielectric layers, formed on the P-type substrate between the source and drain regions of the respective first and second NMOS transistors, and susceptible to deterioration at operation above first and second maximum gate-body voltages, respectively, each of the maximum gate-body voltage being a voltage at which the low-voltage gate dielectric layers is susceptible to deterioration, wherein the high power supply voltage of the multi-power system is greater than the first and second maximum gate-body voltages of the first and second NMOS transistors, and gate electrodes on the gate dielectric layers, respectively, and bodies & sources of the first and second NMOS transistors receiving a bias voltage such that first and second gate-body voltages of the first and second NMOS transistors are less than or equal to the first and second maximum gate-body voltages of the first and second NMOS transistors, respectively.

18. The semiconductor integrated circuit of claim 17, wherein the first and second NMOS transistors are a low-voltage NMOS transistor, respectively, wherein the low-voltage NMOS transistor is only able to endure a low power supply voltage, the low power supply voltage is a voltage lower than the first and second maximum gate-body voltages of the first and second NMOS transistors, respectively.

19. The semiconductor integrated circuit of claim 18, wherein at least one of (1) the sources and (2) the bodies of the first and second NMOS transistors are coupled to a common node.

20. The semiconductor integrated circuit of claim 19, further comprising a current source circuit coupled between the common node and a node having a system ground voltage.

21. The semiconductor integrated circuit of claim 20, wherein:

the P-type substrate is coupled to the system ground voltage;

the deep N-well is coupled to a reversely biasing voltage; and the source and drain regions are n-type impurity doped regions.

22. The semiconductor integrated circuit of claim 19, further comprising a load circuit coupled between the high power supply voltage and the differential switching circuit.

23. The semiconductor integrated circuit of claim 17, wherein the deep N-well is coupled to the high power supply voltage.

* * * * *